(12) United States Patent
Sherry

(10) Patent No.: US 7,737,708 B2
(45) Date of Patent: Jun. 15, 2010

(54) CONTACT FOR USE IN TESTING INTEGRATED CIRCUITS

(75) Inventor: Jeffrey C. Sherry, Savage, MN (US)

(73) Assignee: Johnstech International Corporation, Minneapolis, MN (US)

( * ) Notice: Subject to any disclaimer, the term of this patent is extended or adjusted under 35 U.S.C. 154(b) by 248 days.

(21) Appl. No.: 11/747,006

(22) Filed: May 10, 2007

(65) Prior Publication Data

US 2008/0006103 A1    Jan. 10, 2008

Related U.S. Application Data

(60) Provisional application No. 60/747,031, filed on May 11, 2006.

(51) Int. Cl.
*G01R 31/26* (2006.01)

(52) U.S. Cl. .................................. 324/754; 324/761

(58) Field of Classification Search .......... 324/754–765
See application file for complete search history.

(56) References Cited

U.S. PATENT DOCUMENTS

| | | | |
|---|---|---|---|
| 3,851,249 A * | 11/1974 | Roch ........................... 400/320 |
| 5,061,894 A | 10/1991 | Ikeda ........................... 324/158 |
| 5,084,672 A * | 1/1992 | Ikeuchi et al. ................ 324/761 |
| 6,023,103 A * | 2/2000 | Chang et al. ................. 257/781 |
| 6,166,552 A * | 12/2000 | O'Connell .................... 324/754 |
| 6,242,933 B1 * | 6/2001 | Yap ............................ 324/755 |
| 7,088,118 B2 * | 8/2006 | Liu et al. ...................... 324/754 |
| 7,491,069 B1 * | 2/2009 | Di Stefano et al. ............ 439/74 |
| 2003/0127246 A1 * | 7/2003 | Watanabe et al. ............ 174/254 |

FOREIGN PATENT DOCUMENTS

| | | |
|---|---|---|
| JP | 03 041369 A | 2/1991 |
| JP | 2000 230938 A | 8/2000 |

* cited by examiner

*Primary Examiner*—Vinh P Nguyen
(74) *Attorney, Agent, or Firm*—Nawrocki, Rooney & Sivertson, P.A.

(57) ABSTRACT

A contact for use in a contact set assembly. The contact spans a space which separates a lead of an integrated circuit to be tested and a pad of a load board interfacing with the tester. The contact construction provides electrical communication between integrated circuit lead and the load board pad. Included is an insulating lamina which comprises, in part, a contact. A conductive lamina overlies at least a portion of the insulating lamina. The laminar construction and size and shape of conductive traces applied to a ceramic lamina enable parameters of the contact to be provided.

11 Claims, 9 Drawing Sheets

CONTACT FOR USE IN TESTING INTEGRATED CIRCUITS

CROSS-REFERENCE TO RELATED APPLICATIONS

This is a regular application filed under 35 U.S.C. §111(a) claiming priority, under 35 U.S.C. §119(e) (1), of provisional application Ser. No. 60/747,031 previously filed May 11, 2006 under 35 U.S.C. §111(b).

TECHNICAL FIELD

The present invention deals broadly with testers for evaluating integrated circuit devices and structure for mating leads of the integrated circuit device to corresponding pads of a load board that interfaces with the tester. More narrowly, however, it deals with contacts positioned in an array for electrically connecting the integrated circuit leads with their corresponding load board pads and providing structure for efficiently transmitting test signals. A specific focus of the invention is a particular contact to be used in such an array in order to maintain impedance at a desired level.

BACKGROUND OF THE INVENTION

Integrated circuit tester devices have long been used in industry to test and evaluate the quality of the device being tested. Signal integrity is, of course, an important consideration in conducting testing. It is also desirable to maintain impedance through a conducting portion of a contact interconnecting the integrated circuit lead to its corresponding load board pad at a particular desired level. For example, in the case of testing of many types of devices, 50 ohms is a desired level.

The impedance that is achieved is a function of a number of factors. These include width and length of conduction path, material of which the conductive structure is made, material thickness, etc.

The present invention is a contact which improves the testing function beyond what is achieved with other contacts. It takes into consideration the dictates of the prior art and overcomes problems extant therein.

SUMMARY OF THE INVENTION

The invention is a contact which spans a space which separates a lead of an integrated circuit to be tested by a tester apparatus and a pad of a load board interfacing with the tester. The contact thereby provides electrical communication between the integrated circuit lead and the load board pad. The contact includes an insulating lamina which has oppositely facing sides and a profile which includes a first end engageable by the lead of the integrated circuit. The profile also has a second end which is in engagement with a pad of the load board. A conductive lamina overlies at least a portion of the insulating lamina. The conductive lamina also extends from the first end of the insulating lamina to the second end thereof. The thickness of the conductive lamina is expanded at the first and second ends of the insulating lamina. Consequently, a first end of the conductive lamina is more effectively engaged by the lead of the integrated circuit, and a second end of the conductive lamina, proximate the load board, more effectively engages the pad of the load board.

In one embodiment of the invention, the conductive lamina comprises a first trace which is applied to one side of the insulating lamina. This first conductive trace extends from the first end of the insulating lamina to its second end. This embodiment also includes a second conductive trace which overlies at least a part of the other side of the insulating lamina and also extends from the first end to the second end of that lamina. In a preferred embodiment, the first and second conductive traces extend beyond the first end of the insulating lamina and include means, extending from the conductive traces, for cutting through oxide build-up on the lead of the integrated circuit which engages the contact. Typically, tin oxide will build up on the surface of the integrated circuit device lead.

The means for cutting through an oxide build-up, it is intended, would include an elongated blade edge. Such a blade edge would extend from each conductive trace at its first or upper end. In one envisioned construction, these blade edges would extend generally parallel to one another. Similarly, they would, in turn, be generally parallel to a plane defined by a surface of the contact. Because of intended elastomeric mounting of the contact, the blade edges, when engaged by a lead of an integrated circuit, would move linearly in a direction of the lay of the blade edges when they are not engaged by an integrated circuit.

It will be understood that the conductive laminae or traces can be either sandwiched between lateral insulating layers or together, sandwich an insulating layer between two conductive laminae. The specific construction would, of course, depend upon the application of the tester, whether the housing in which the elastomeric mounting of the contact was accomplished were metallic, etc.

Certain embodiments of the invention can provide for redundant contacting. Such a concept could enable reduction in size of components to support pitch lower than 0.5 mm. With use of a ceramic insulating material, the effects E-field radiating could be greatly reduced or eliminated.

It is envisioned that the insulating lamina would be made of a ceramic or another non-conductive material. It has been found that such a material tends to be the best of a number of choices to serve such a purpose.

The present invention is thus an improved contact for use in integrated circuit testing. More specific features and advantages obtained in view of those features will become apparent with reference to the DETAILED DESCRIPTION OF THE INVENTION, appended claims and accompanying drawing figures.

DETAILED DESCRIPTION OF THE INVENTION

Figure 2:
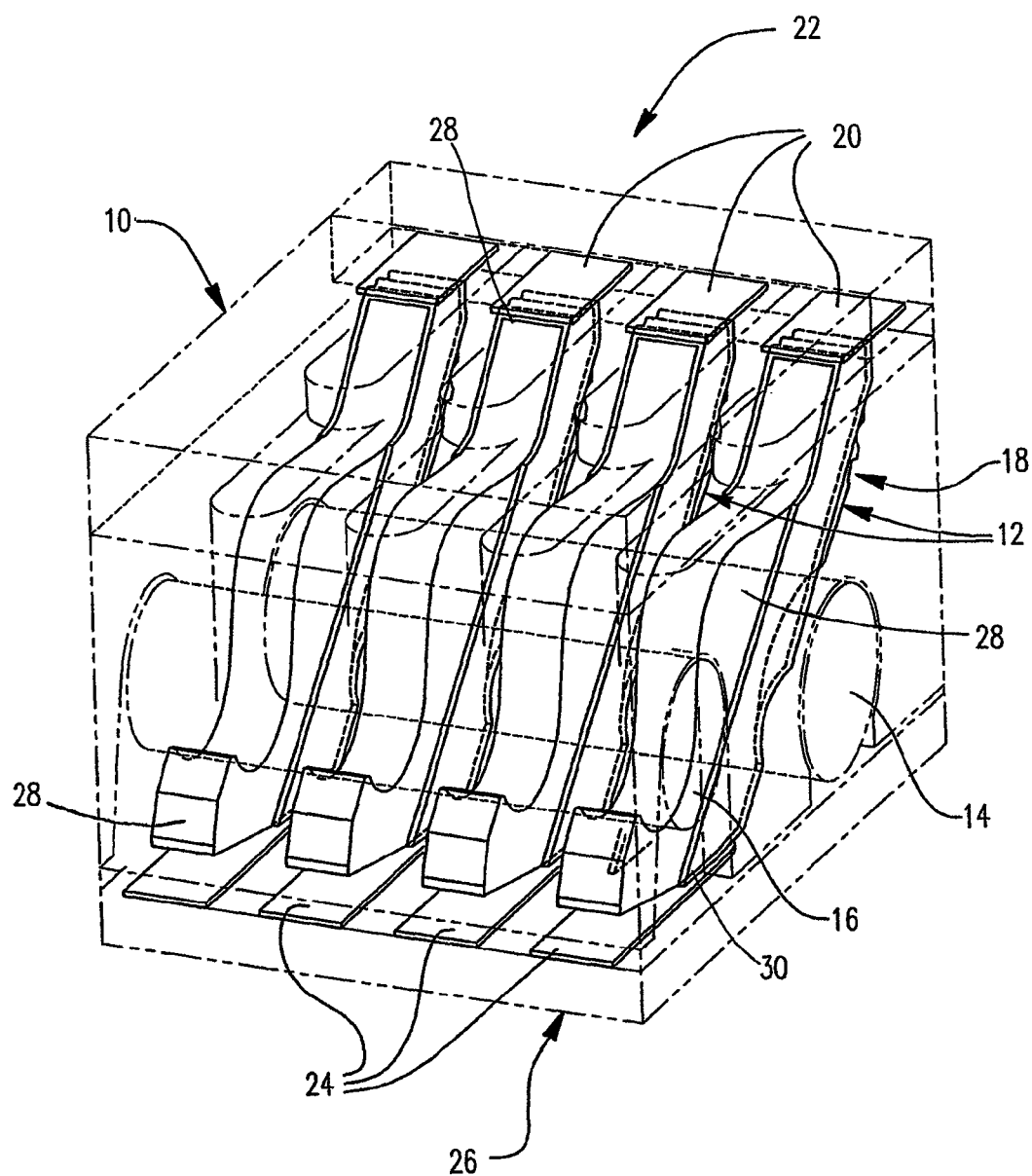
FIG. 2 is a perspective view of the portion illustrated in FIG. 1.

Referring now to the drawing figures wherein like reference numerals denote like elements throughout the several views, FIG. 2 illustrates a contact away 10 for use in a test socket. Such an away 10 employing contacts 12 in accordance with the present invention uses substantially cylindrical elastomers 14, 16 to mount the contacts 12 within slots in a housing 18. The housing 18, in turn, enables contacts to span the distance between leads 20 of an integrated circuit device 22 to be tested, when the device is in an appropriate location, and pads 24 on a load board 26 which interfaces with the tester apparatus (not shown). FIG. 2 illustrates a segment of a test socket mounting four contact elements. It will be understood, of course, that this number is not exclusive. In fact, the typical integrated circuit will dictate the employment of considerably more contacts so that at least one contact will be present to provide electrical signal transmission between each lead 20 of the integrated circuit device 22 and its corresponding load board pad 24.

Figure 1:
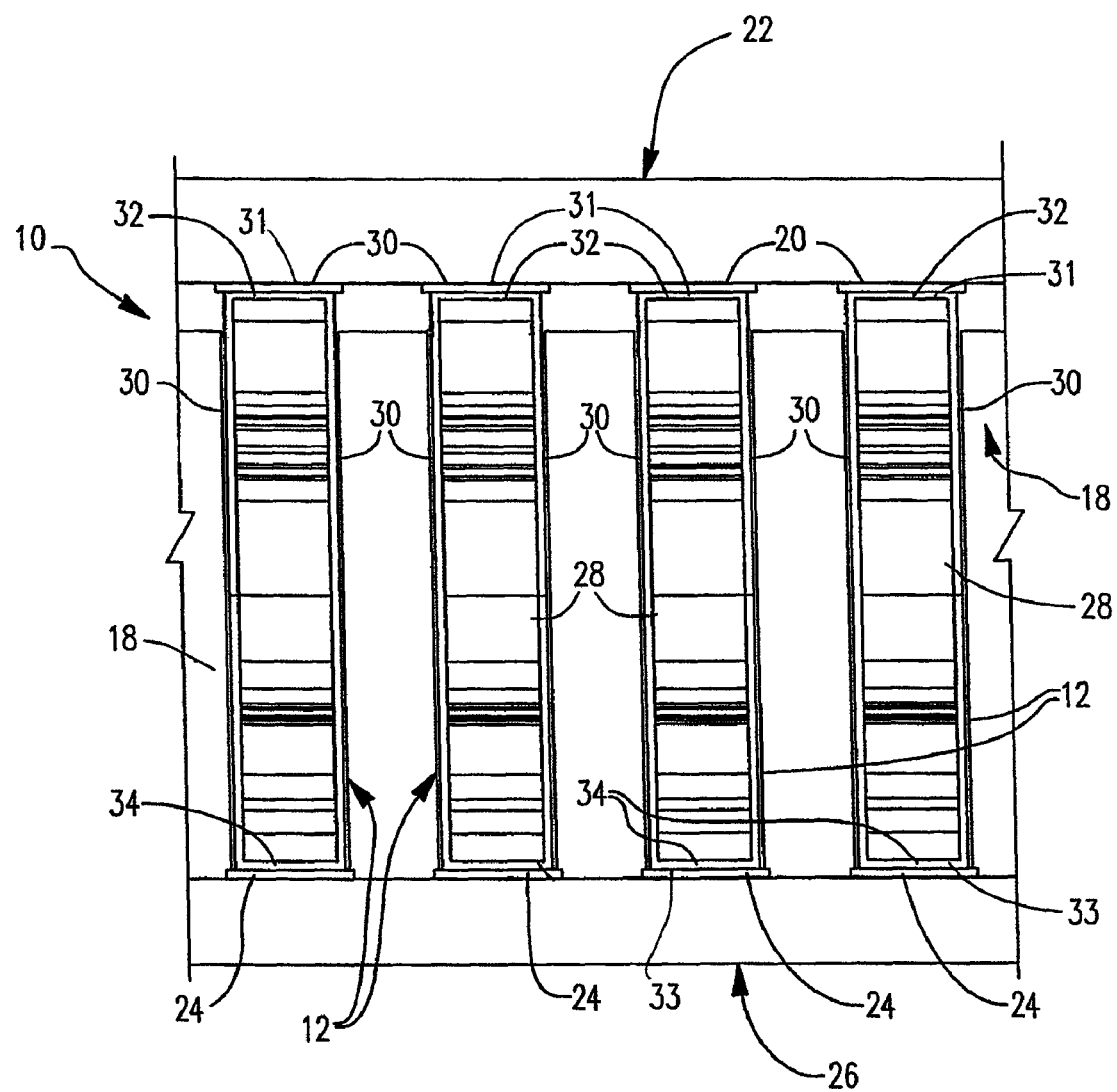
FIG. 1 is a side elevational view of a portion of a set of contacts in accordance with the present invention spanning a space between, and interconnecting, corresponding leads of an integrated circuit device and corresponding pads of a load board which interfaces with a tester.
Figure 3:
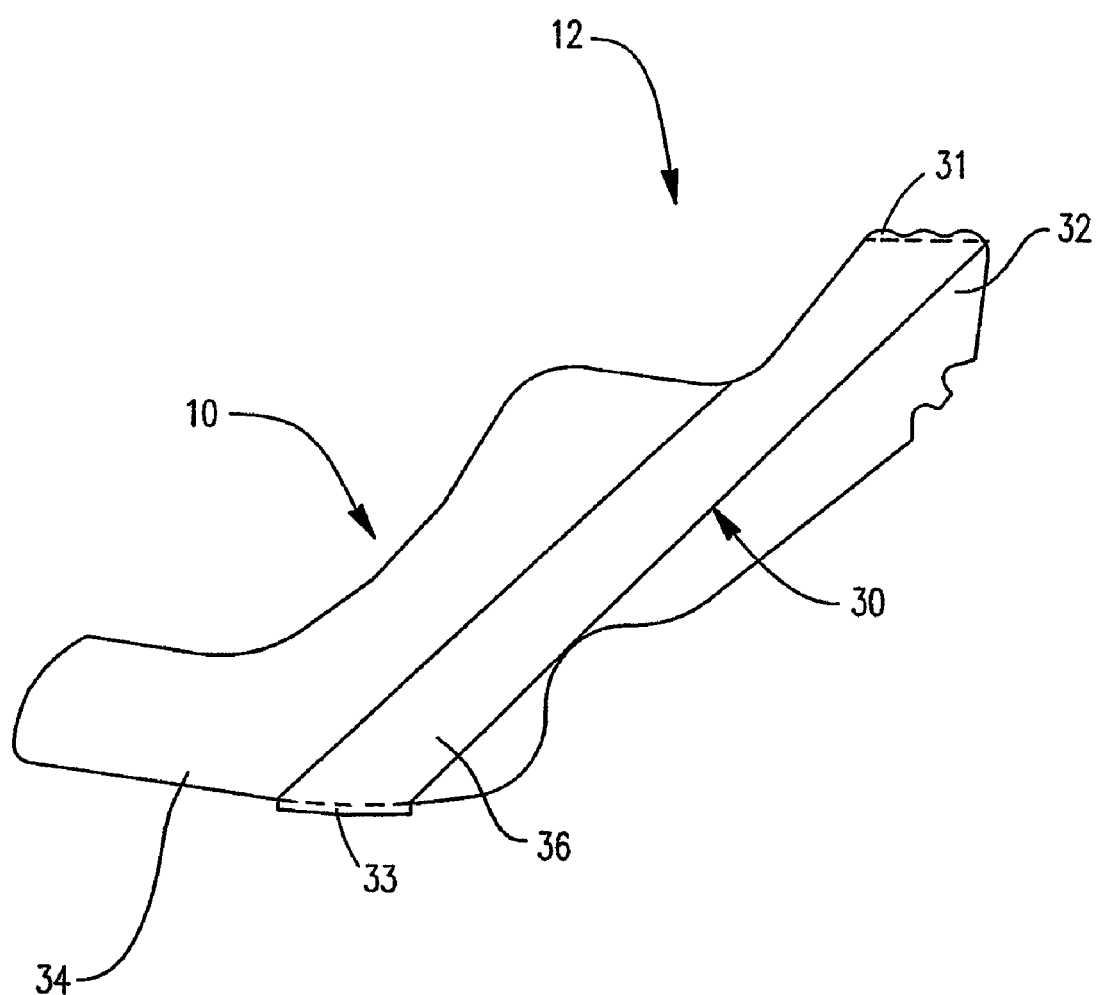
FIG. 3 is a side elevational view of a ceramic lamina contact having conductive trace material plated on a side of the contact.

The contact set illustrated in FIG. 2 is shown in more detail in FIG. 1. Each contact 12 is provided with an insulating lamina 28. The lamina 28, in turn, has a conductive trace 30 applied to each of opposite sides thereof. A trace 30 is applied in an overlying relationship to at least a portion of the insulating lamina 28 and extends from a first end 32 of the insulating lamina 28 to a second end 34 thereof. FIG. 3 illustrates a trace 30 which generally takes the form of a band 36 applied to a ceramic insulating lamina so that, when an integrated circuit 22 is engaged with upper ends of the contacts 12 comprising the array 10, an electrical path will be provided between each integrated circuit lead 20 and the corresponding load board pad 24. Such a band 36 can be of any width or length to match impedance of the device I/O. Its width can also vary to generate stubs (not shown) that could optimally match device I/O to a certain impedance or represent an inductive or capacitive element.

It will be understood that a symmetrical trace 30 would be applied to the other side of the contact insulating lamina 28 also. Symmetry of the traces 30 will afford a substantially identical redundancy.

As seen in FIG. 1, each trace 30 connects to a conductive point of engagement 31 rigidly mounted on the first end of the contact 12. Each point of engagement 31 contacts the lead 20 of the integrated circuit 22 to form electrical connection therewith. Similarly, FIG. 1 illustrates contact 12 as having a conductive point of engagement 33 to which each trace 30 connects. Each point of engagement 33 contacts the load board pad 24 to form electrical connection therewith. Most of the contact 12 width is furnished by the ceramic insulating lamina 28. As a result, signals will be transmitted through the traces 30 on contact 12 in an efficient manner. Again, the symmetry of the traces 30 on opposite sides of the same contact insulating lamina 28 will provide substantially the same response irrespective of signal transmission path.

The type of ceramic material selected and the material and geometry of the traces 30 are chosen in order to achieve a desired impedance. In a particular application, an impedance of 50 ohms is desirable. The shape and route of the traces 30 can be varied, as necessary, to achieve the impedance desired.

Further, a decoupling component 38 could be mounted on the contact trace 30 to create a smart contact which would allow for production testing mimicking real-world applications.

Further, the relative location of the traces 30 on the insulating lamina 28 would facilitate the accommodation of smaller pitch devices. Thus, the particular shape, size and orientation of traces 30 are factors to be considered in creating the contacts 12.

Figure 4:
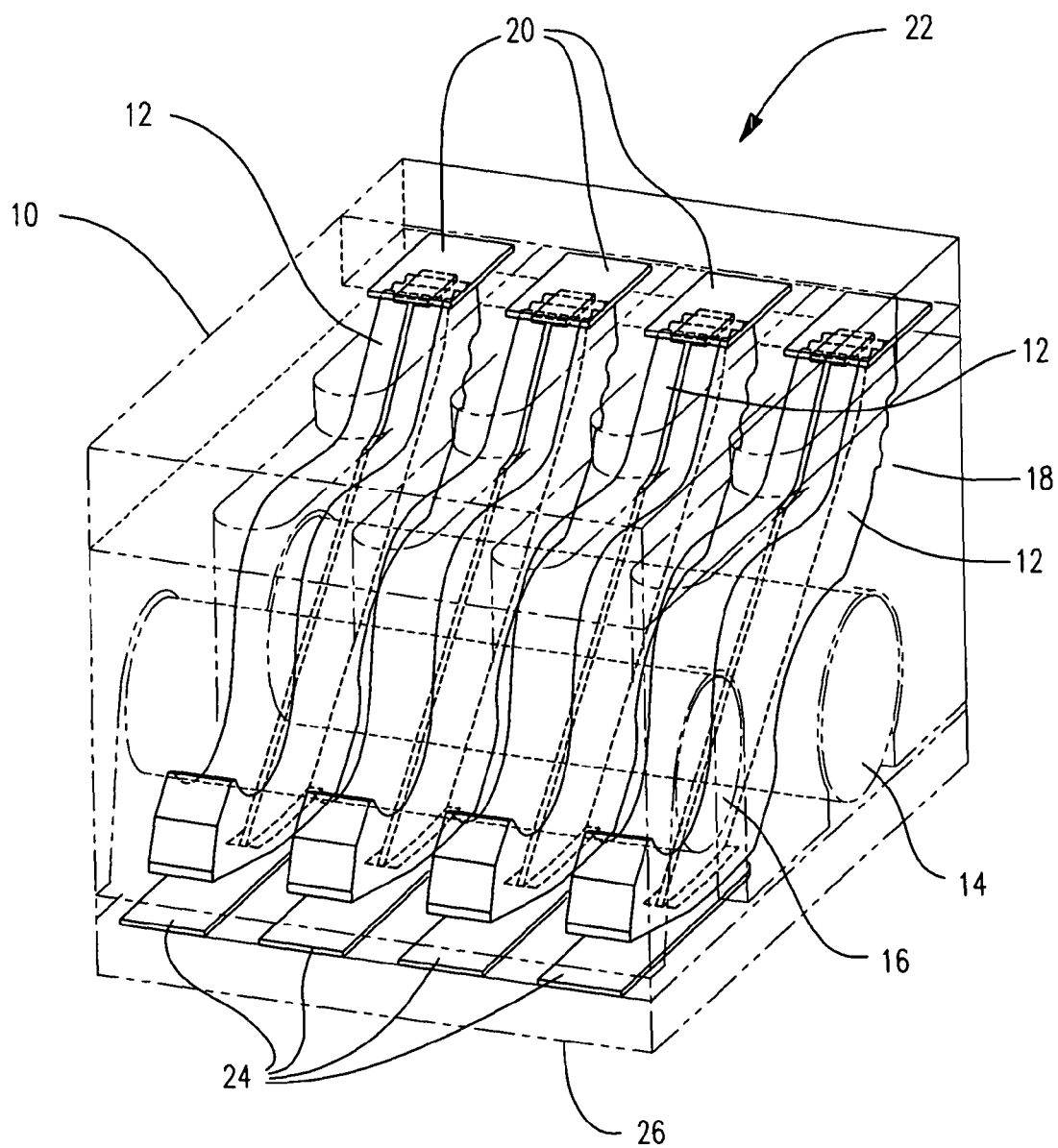
FIG. 4 is a perspective view of a further embodiment of the invention illustrating a ceramic contact array wherein a controlled impedance trace is sandwiched between two nonconductive layers.
Figure 5:
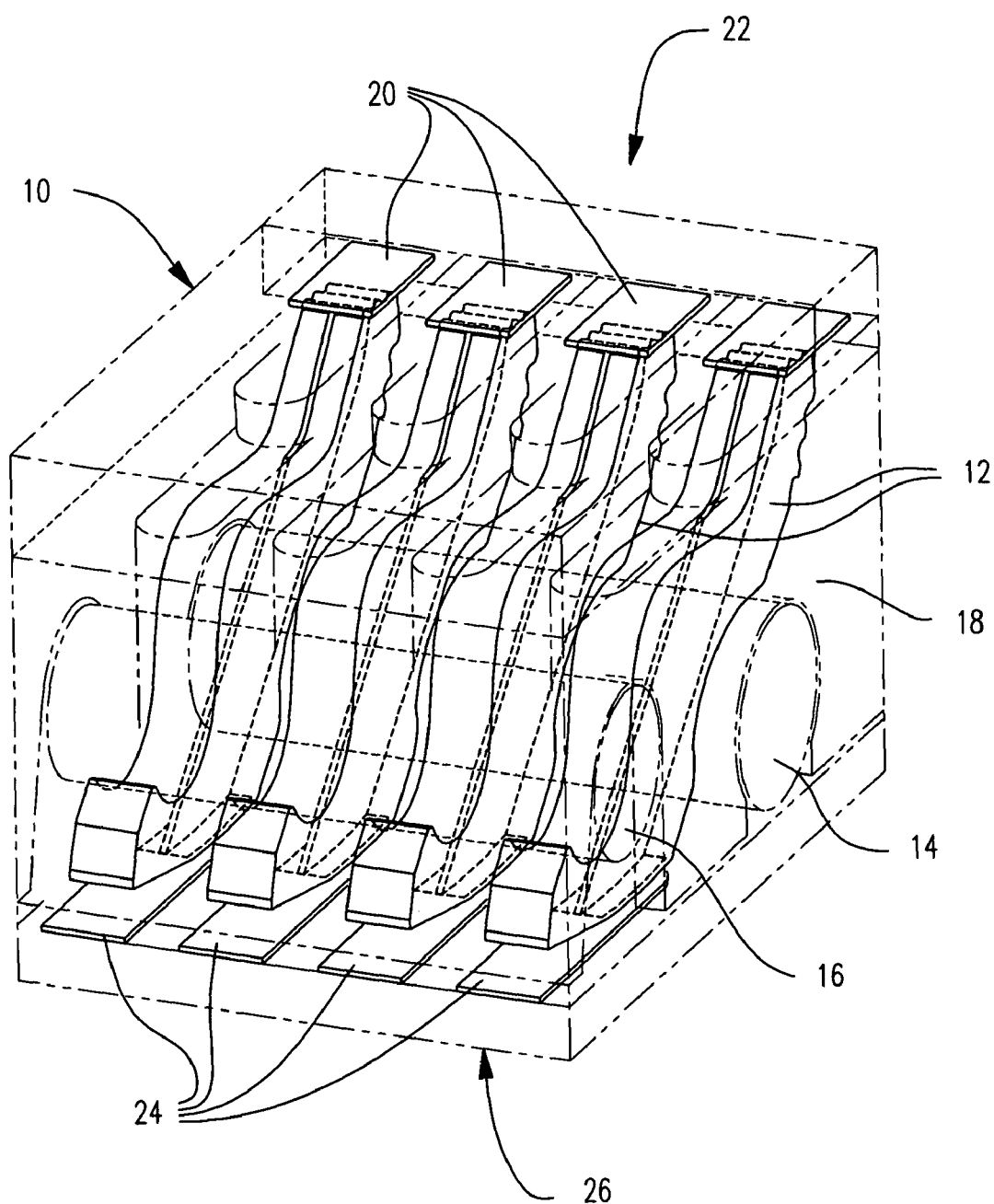
FIG. 5 is a view similar to FIG. 4 but illustrating full pad interface.

FIGS. 4 and 5 illustrate, in different degrees of pad interfacing, a second contact embodiment array. Mounting of each contact 12 is similar to that employed in mounting the embodiment previously discussed. FIG. 4 is a view illustrating a recessed pad construction. FIG. 5 is a view illustrating full pad interface. Components are, otherwise, substantially the same as components illustrated in FIGS. 1 and 2.

The only difference between FIGS. 4 and 5 and 1 and 2 previously discussed is that there is one conductive element in the center of the contact element. Running the conductive element inside the lamina creates many additional benefits in addition to impedance matching. The conductive elements are separated farther away to reduce crosstalk. The contacts could be placed in a metal housing to further reduce crosstalk and improve isolation. The lamina could be removed in sections and a capacitor or an inductor could be installed directly on contact 12 (FIG. 9) creating better signal integrity and decoupling device power I/O.

Figure 6:
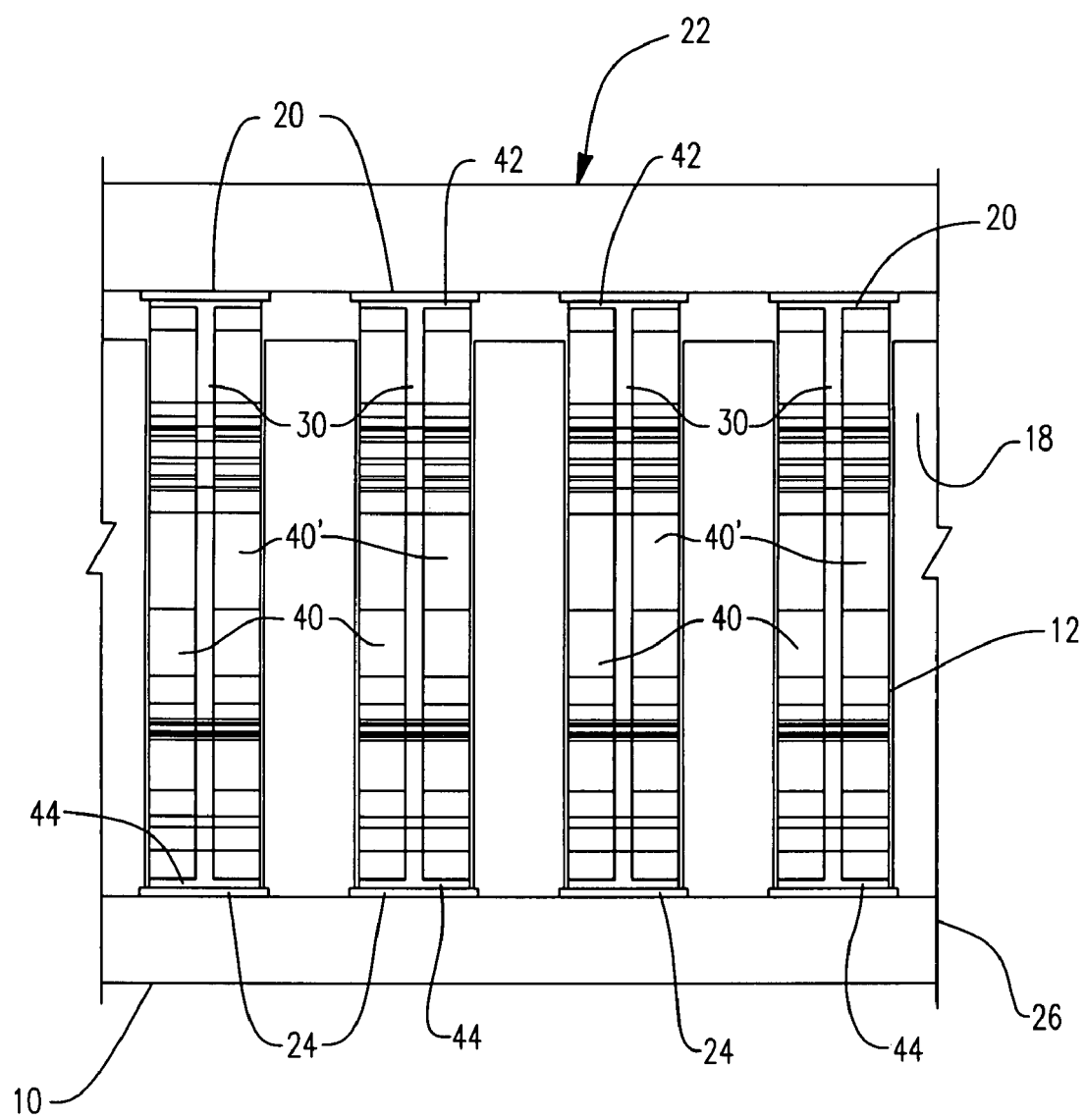
FIG. 6 is a view similar to FIG. 1 illustrating the second embodiment of the invention.

FIG. 6 illustrates a series of contacts 12 wherein the conductive trace 30 is interior to the contact 12. That is, the trace is laterally central in the contact 12 with nonconductive laminae 40, 40' sandwiching the conductive trace 30 therebetween. At ends of the traces 30, however, engagement portions 42, 44, extending generally normal to a plane defined by the internal trace 30, is provided. One transverse portion 42 is engaged by the lead 20 of the integrated circuit device 22, and another transverse portion 44 engages a corresponding load board pad 24. Such a contact construction offers variation in design in view of desired impedance, facilitation of good inter-engagement and significant signal transmission. The conductive portion of a contact so constructed is physically separated farther from an adjacent contact's conductive portion. This results in improved crosstalk performance. The "I-beam" construction is structurally strong and will result in enhanced mechanical performance. The top and bottom portions 42, 44 can be recessed from edges to accommodate recessed device I/O leads 20 and result in the contact being able to be incorporated into a totally metal housing for improved thermal and ground inductance.

Figure 8:
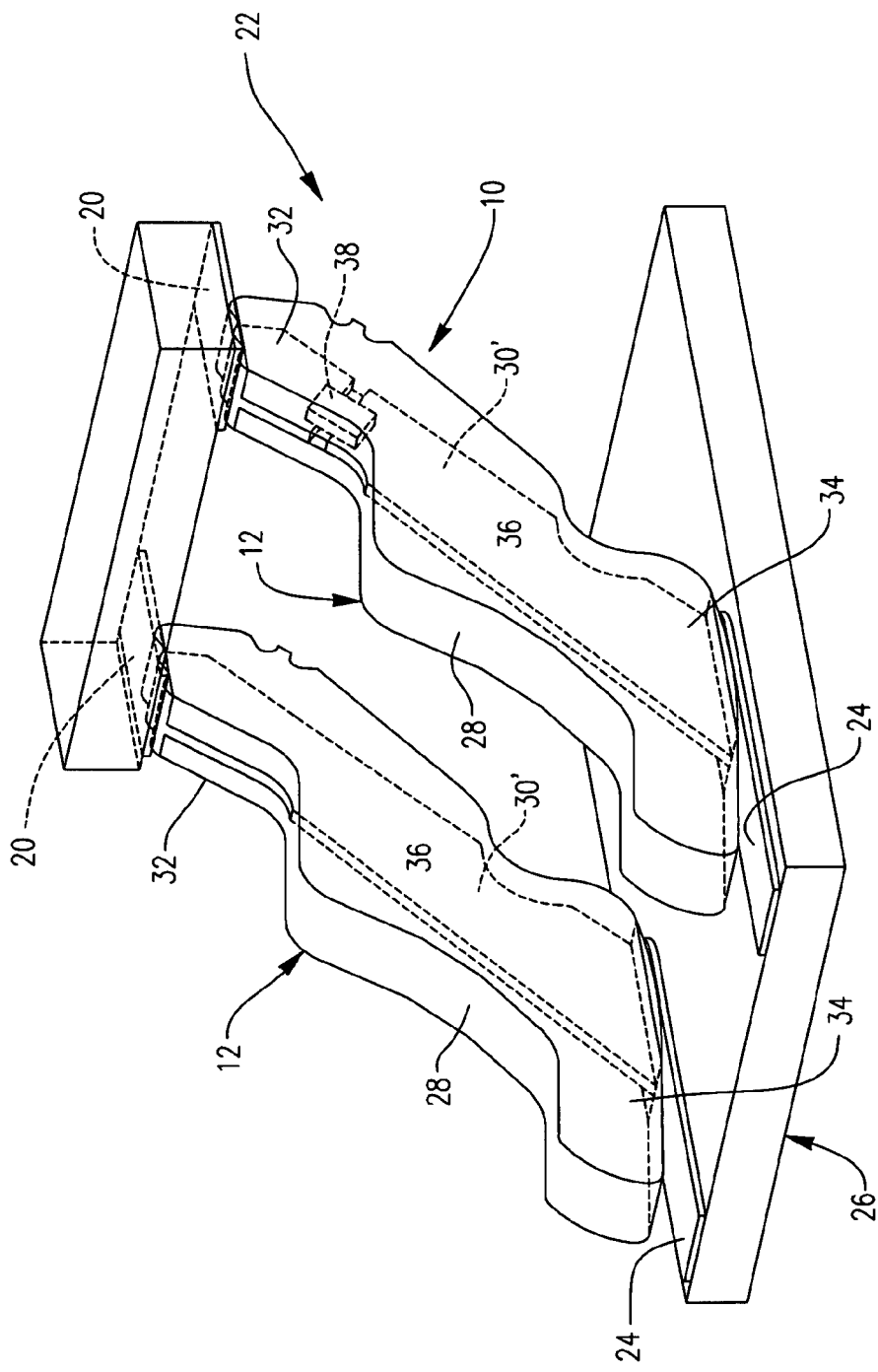
FIG. 8 is a view similar to FIG. 2 illustrating a contact including an attached decoupling component.
Figure 9:
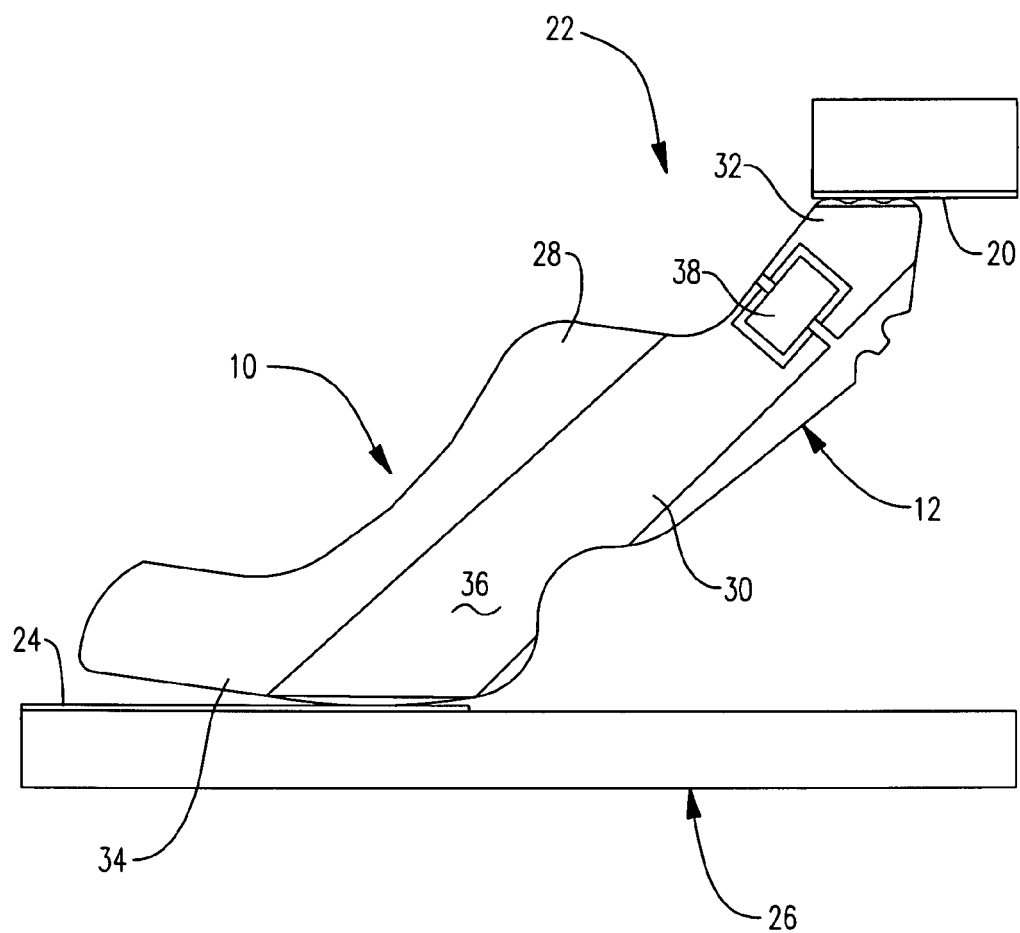
FIG. 9 is a side elevational view of the contact of FIG. 8.

Again, FIGS. 8 and 9 illustrate the application of a decoupling component 38. The construction and advantages of such an embodiment are discussed hereinbefore.

Figure 7:
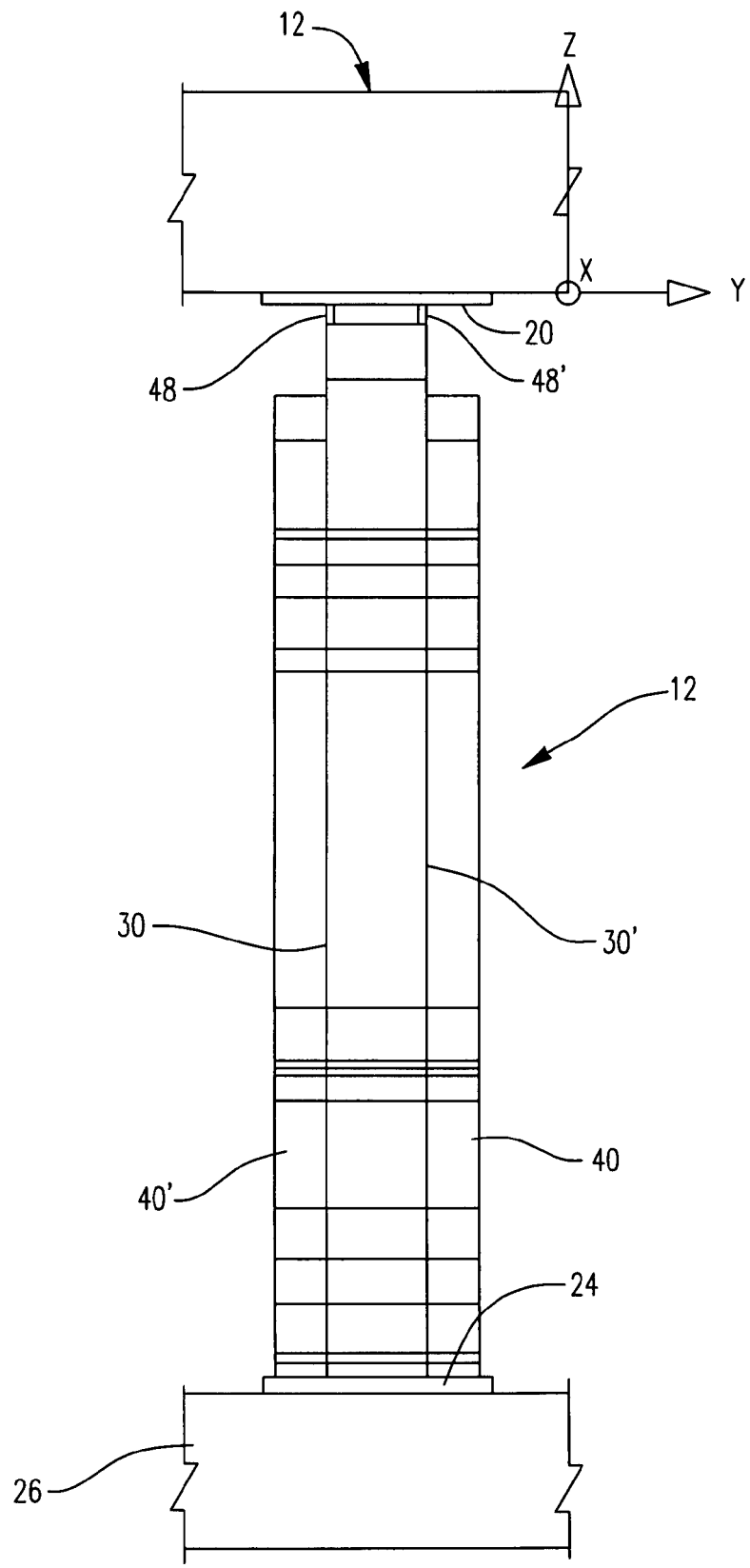
FIG. 7 is an elevational view illustrating a third contact embodiment interconnecting the integrated circuit lead and the load board pad.

FIG. 7 illustrates a further embodiment of a contact in accordance with the present invention. In some degree, the contact of FIG. 7 is similar to the contacts shown in FIG. 6. That is, nonconductive laminae 40, 40' sandwich a conductive trace element 30 therebetween. In fact, however, the contact of FIG. 7 is a hybrid of the contacts of FIG. 1 and FIG. 6. That is so because a central core 46 is provided from a nonconductive ceramic material. Dual traces 30, 30' are applied to oppositely-facing sides of the central core 46, and the nonconductive side components 40, 40' are overlain to complete the contact. In this embodiment, however, means for cutting through oxide build-up on the integrated circuit device lead are provided. Such means can take the form of an elongated blade edge 48, 48' extending from one or both of the conductive traces 30, 30'. As seen best in FIG. 7, the blade-like elements 48, 48' extend distally with respect to the traces 30, 30' and are engaged by a lead 20 of the integrated circuit device 22. Typically the device leads 20 are made of matte tin. When this material is used for the leads, tin oxide can build up and diminish the integrity of operation of the contact transmission element. Because of the blade edges 48, 48' of the traces 30, 30', a very fine etch through the tin oxide will occur and the integrity of signal transmission will not be diminished. The blade edge size can be increased or the radius changed to adjust and control the forces applied to the device I/O to minimally break through tin oxides without creating damage to the device I/O leads 20.

It will be understood that the degree of pressure with which the blade edges 48, 48' are applied to the tin oxide is a function of the elastomers 14, 16 by which the contacts 12 are mounted. Appropriate elastomers will be selected depending upon the degree of oxidation of the integrated circuit leads and other factors.

As will be seen, the present inventive concept includes use of a ceramic material to form one or more laminae of a transmission contact 12 with one or more conductive traces 30, 30' applied to nonconductive ceramic portions. By varying the laminar structure, the size, shape and other features of the traces and other factors, a desired impedance level can be achieved. Conductive traces and the particular construction involved enables a contact 12 to be used with recessed pad devices or, when the ceramic laminae are manipulated, with metal housings. In consequence, the electrical match, inductance and crosstalk are improved. The principles involved can be applied when using a greater than air dielectric material to plate surfaces of a contact. Again, matching characteristics and greatly reduced signal propagation to other contacts in the housing structure will be improved. That is, crosstalk will be reduced.

It will be understood that this disclosure, in many respects, is only illustrative. Changes may be made in details, particularly in matters of shape, size, material, and arrangement of parts without exceeding the scope of the invention. Accordingly, the scope of the invention is as defined in the language of the appended claims.

What is claimed is:

1. A contact spanning a space separating, and for providing electrical communication between, a single lead of an integrated circuit to be tested by a tester apparatus and a pad of a load board interfacing with the tester apparatus, said contact comprising:
   a rigid insulating lamina having oppositely facing sides and a profile including a first end and a second end:
   first and second conductive points of engagement rigidly mounted on the first and second ends respectively of the insulating lamina, said first conductive point of engagement for engaging the lead of the integrated circuit and said second conductive point of engagement for engaging the pad of the load board;
   a first conductive trace on one side of said insulating lamina and extending from said first end of said insulating lamina to said second end thereof and electrically connected to each of the first and second conductive points of engagement, for electrical connection to the lead and the pad respectively through the first and second conductive points of engagement; and
   a second conductive trace on the other side of said insulating lamina and extending from said first end of said insulating lamina to said second end thereof and electrically connected to each of the first and second conductive points of engagement, for electrical connection to the lead and the pad respectively through the first and second conductive points of engagement.

2. A contact in accordance with claim 1 further comprising means extending from at least one of said first and second conductive traces beyond said first end of said insulating lamina, said means for cutting through oxide build-up on the lead engaging said contact.

3. The contact in accordance with claim 2 including elastomeric means for elastically applying force to said lamina.

4. The contact in accordance with claim 3 wherein said insulating lamina is made of a ceramic material.

5. The contact in accordance with claim 3 wherein said first end of said insulating lamina is an upper end and said second end of said insulating lamina is a lower end.

6. The contact in accordance with claim 5 wherein said means for cutting through oxide build-up includes an elongated blade edge extending from each conductive trace adjacent to and past the lamina's first end.

7. The contact in accordance with claim 6, and including a second adjacent and substantially identical contact, wherein said blade edges of each contact are in substantial alignment with each other.

8. The contacts in accordance with claim 7 wherein said contacts' blade edges are generally aligned with parallel to a plane defined by said contacts' traces.

9. The contacts in accordance with claim 8 wherein said blade edges have size and radii that, when engaged by a lead of an integrated circuit, break through oxides on the lead without creating damage to the lead.

10. The contact in accordance with claim 2, and including a housing having a slot therein holding the contact, and elastomeric means interposed between the contact and the housing for elastically applying force to said lamina.

11. The contact in accordance with claim 10, including a plurality of similar contacts, and wherein the housing includes a plurality of slots, each holding one of the contacts, wherein the elastomeric means applies force to each contact of the plurality of contacts.

* * * * *